US007136281B2

(12) United States Patent
Yang

(10) Patent No.: US 7,136,281 B2
(45) Date of Patent: Nov. 14, 2006

(54) DISPLAY AND ELECTRICAL CONNECTION STRUCTURE THEREOF

(75) Inventor: Hui-Chin Yang, Taipei (TW)

(73) Assignee: Hannspree Inc., Taipei (TW)

( * ) Notice: Subject to any disclaimer, the term of this patent is extended or adjusted under 35 U.S.C. 154(b) by 85 days.

(21) Appl. No.: 11/018,279

(22) Filed: Dec. 21, 2004

(65) Prior Publication Data

US 2006/0078143 A1 Apr. 13, 2006

(30) Foreign Application Priority Data

Oct. 8, 2004 (TW) .............................. 93215981 U

(51) Int. Cl.
*H05K 7/16* (2006.01)

(52) U.S. Cl. ........................ 361/681; 16/342; 355/128; 345/1.1

(58) Field of Classification Search .................. 16/342; 200/61.7, 400; 355/128; 439/331; 345/1.1; 361/679–687, 724–727, 736
See application file for complete search history.

(56) References Cited

U.S. PATENT DOCUMENTS

| | | | | |
|---|---|---|---|---|
| 3,239,628 | A * | 3/1966 | Lesser | 335/128 |
| 3,729,603 | A * | 4/1973 | Foltz | 200/61.7 |
| 2005/0204509 | A1 * | 9/2005 | Lin et al. | 16/342 |

* cited by examiner

*Primary Examiner*—Hung Van Duong
(74) *Attorney, Agent, or Firm*—Thomas, Kayden, Horstemeyer & Risley

(57) ABSTRACT

A display and an electrical connection structure thereof. In the electrical connection structure, a first conduction module and a second conduction module are pivoted on a shaft with an insulator. The second conduction module is capable of rotating with respect to the first conduction module. The insulator is disposed between the first and second conduction modules, thereby insulating the first conduction module from the second conduction module.

18 Claims, 7 Drawing Sheets

DISPLAY AND ELECTRICAL CONNECTION STRUCTURE THEREOF

BACKGROUND

The invention relates to an electrical connection structure, and in particular to an electrical connection structure connecting two electronic devices and acting as a pivot mechanism for same.

Some conventional displays have built-in speakers. Various means of connection are provided for different designs and configurations. A pivoting connection provided between electronic devices is feasible.

In many electronic devices, two or more electronic modules are pivoted together for particular functions. For example, a display of a laptop or a personal digital assistant is pivoted to a body thereof. Electrical connection between the electronic modules must be maintained to transmit power or electrical signals therebetween. Typical electrical connection is accomplished by disposing signal cables in the pivot connecting the electrical modules. U.S. Pat. No. 6,782,273 discloses a portable wireless apparatus comprising an antenna section pivoted on a first housing. A hinge mechanism between the antenna section and the first housing comprises a first ring shaft portion and a second ring shaft portion configured in concentric circles. Protrusions connected to a signal cable are disposed on the first and second ring shaft portions. In such a structure, a space must be preserved between the first and second ring shaft portions for the protrusions. Thus the hinge mechanism occupies a considerable volume.

SUMMARY

An electrical connection structure according to an embodiment of the invention comprises a shaft, a first conduction module and a second conduction module. The shaft is provided with an insulator. The first conduction module is pivoted on the shaft and the second conduction module is also pivoted on the shaft and rotated with respect to the first conduction module. The insulator is disposed between the first and second conduction modules, thereby insulating the first conduction module from the second conduction module.

The first conduction module comprises a first conductor pivoted on the shaft, and a second conductor pivoted on the shaft. The second conductor is electrically connected to the first conductor and capable of rotating with respect to the first conductor.

The second conduction module comprises a third conductor pivoted on the shaft, and a fourth conductor also pivoted on the shaft. The fourth conductor is electrically connected to the third conductor and capable of rotating with respect to the third conductor. The insulator is disposed between the second and third conductors, thereby insulating the second conductor from the third conductor so as to insulate the first conduction module from the second conduction module.

The shaft further comprises a first portion and a second portion. The first and second conductors are pivoted on the first portion, and the third and fourth conductors are pivoted on the second portion. The second portion joins the first portion via the insulator, whereby the first portion is insulated from the second portion.

BRIEF DESCRIPTION OF THE DRAWINGS

The invention can be more fully understood by reading the subsequent detailed description and examples with references made to the accompanying drawings, wherein.

DETAILED DESCRIPTION

Figure 1:
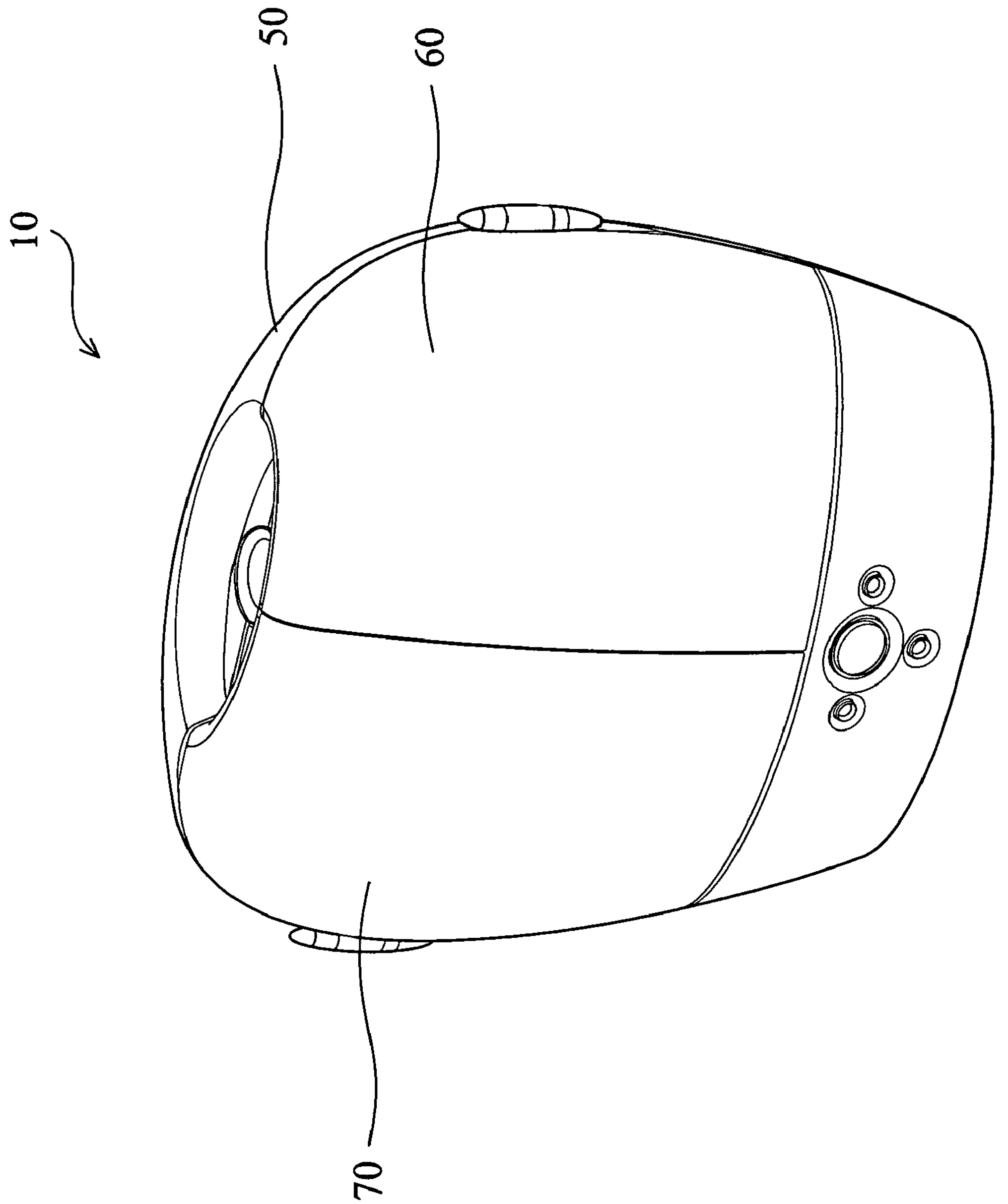
FIG. 1 is a perspective view of a display according to an embodiment of the invention.
Figure 2:
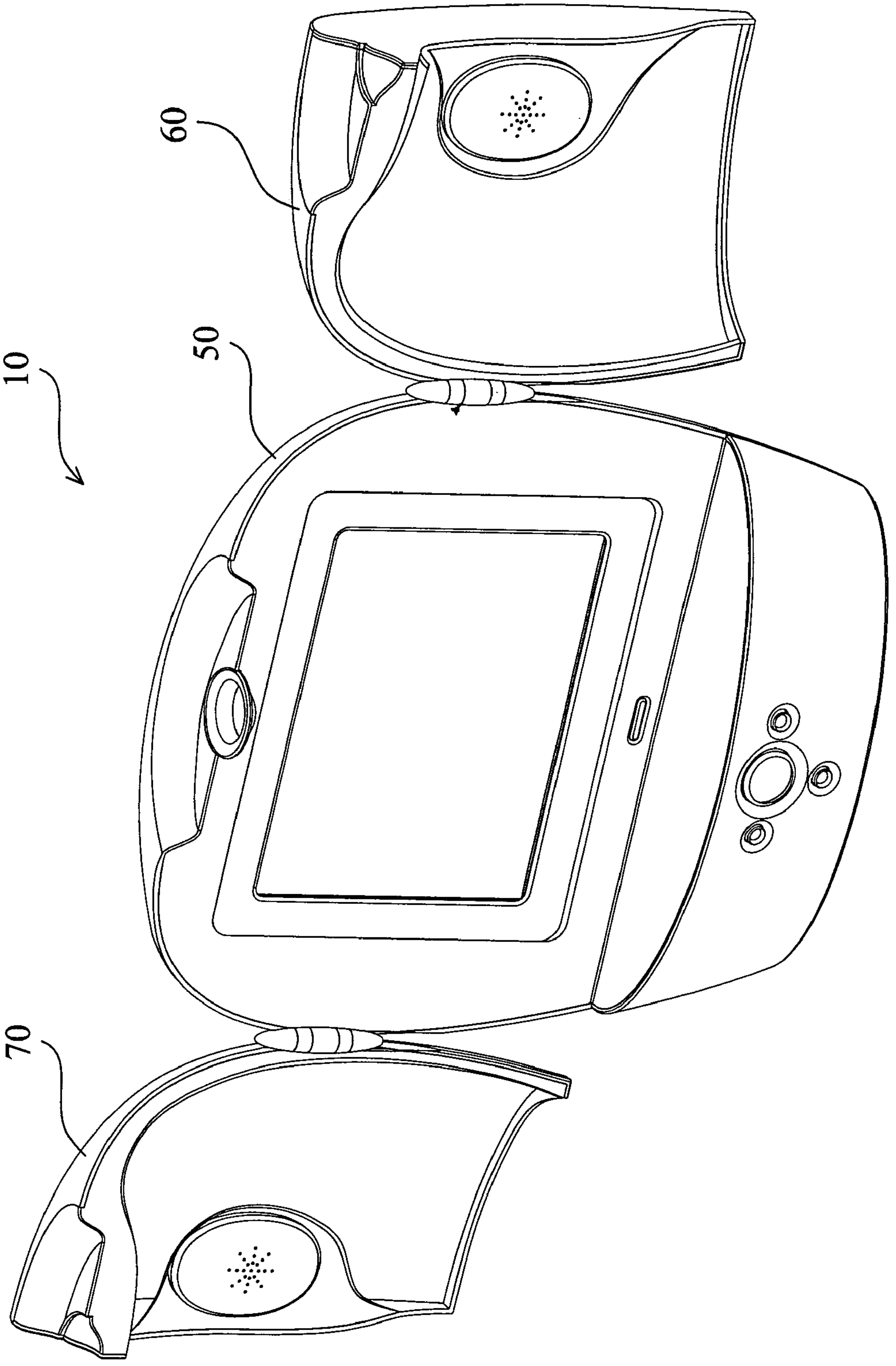
FIG. 2 is another perspective view of a display according to an embodiment of the invention.

FIGS. 1 and 2 depict a display 10 comprising a main body 50 and two speakers 60 and 70 pivoted to the main body 50 and capable of opening or closing.

Figure 3:
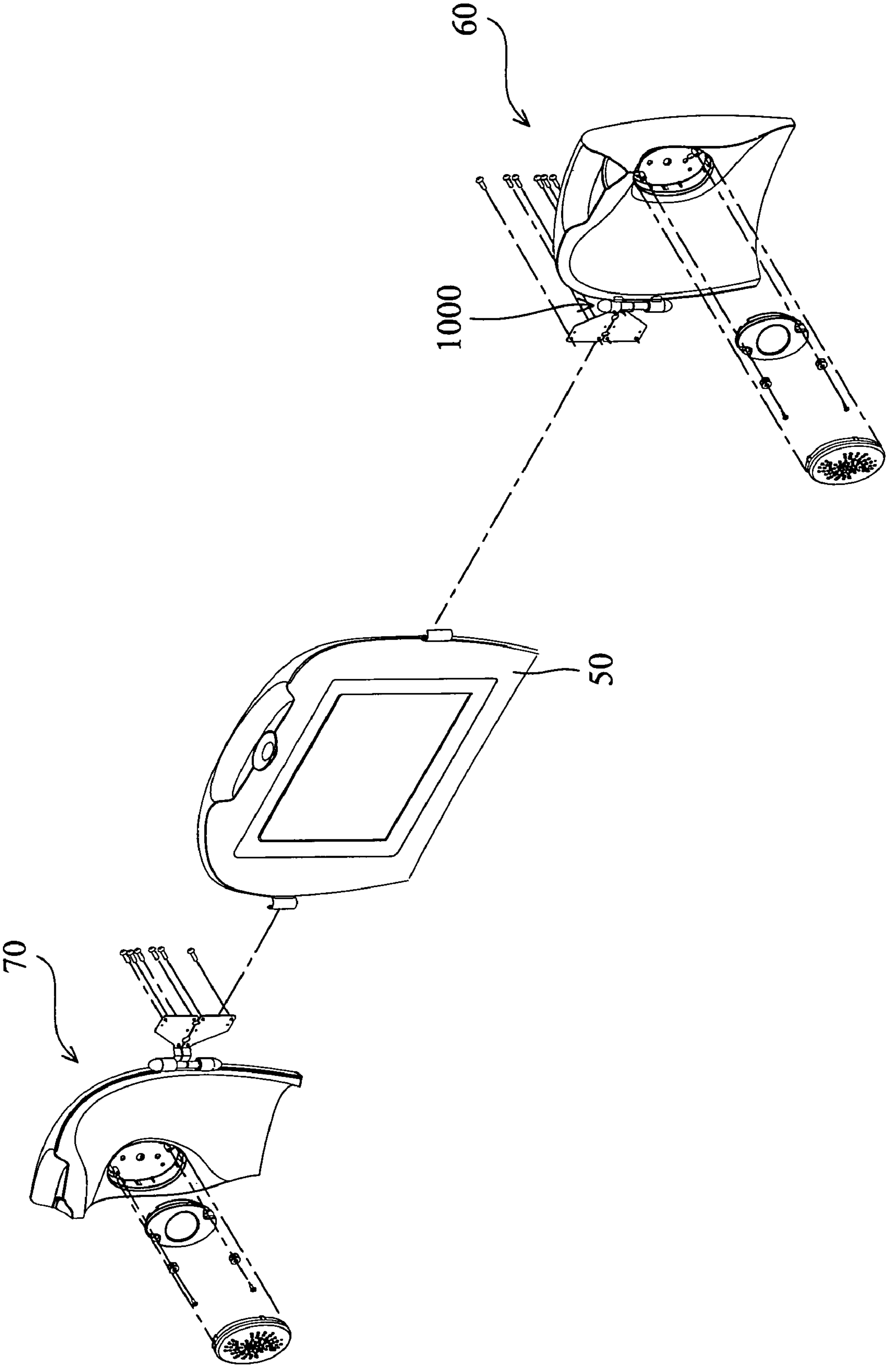
FIG. 3 is an exploded perspective view of a display according to an embodiment of the invention.
Figure 4:
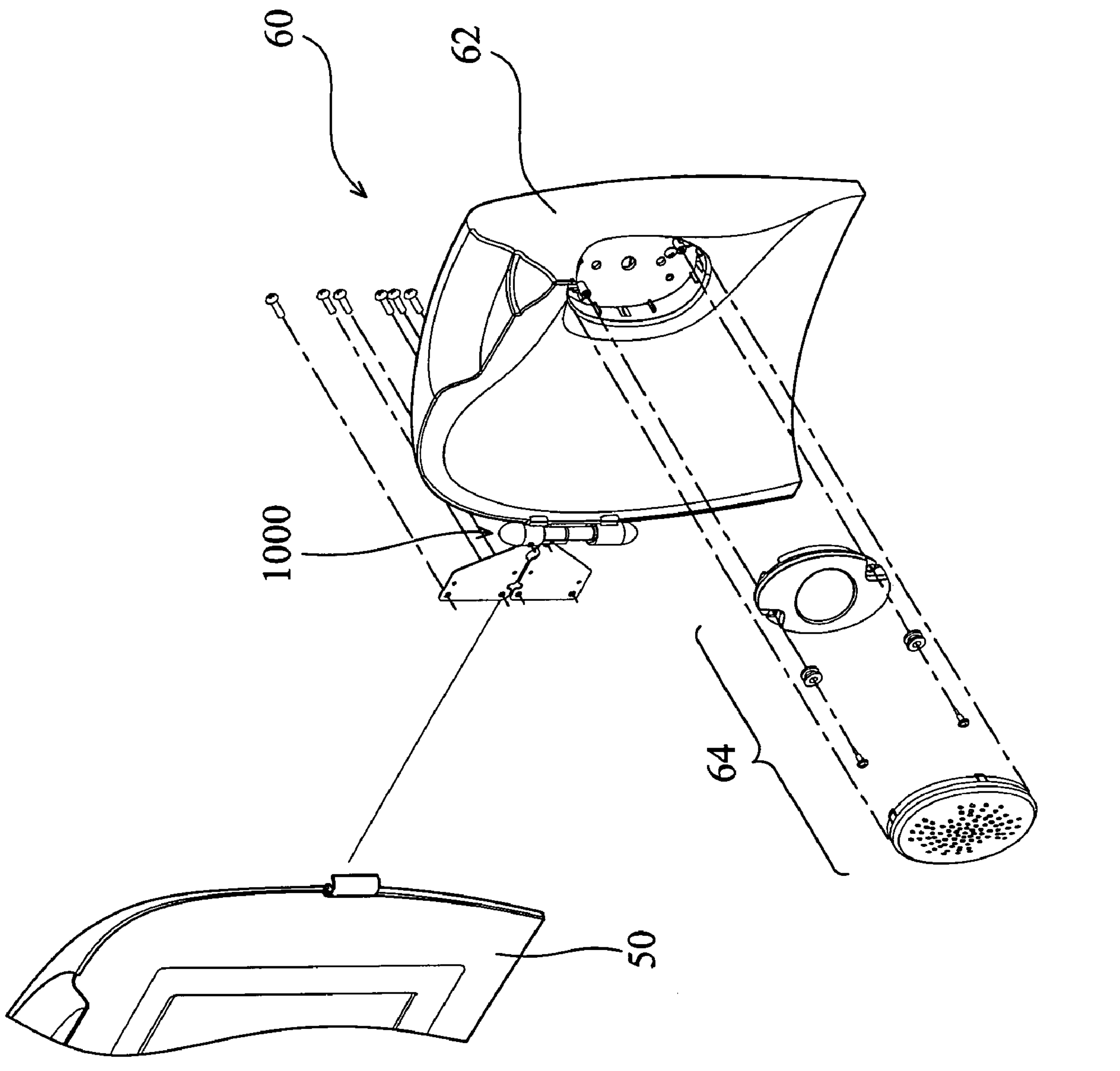
FIG. 4 is a partially enlarged view of FIG. 3.

FIGS. 3 and 4 depict an electrical connection structure 1000 disposed between the speaker 60, which comprises a body 62 and a speaker module 64, and the main body 50 to transmit signals and power therebetween and also serve as a pivot mechanism therebetween.

Figure 5:
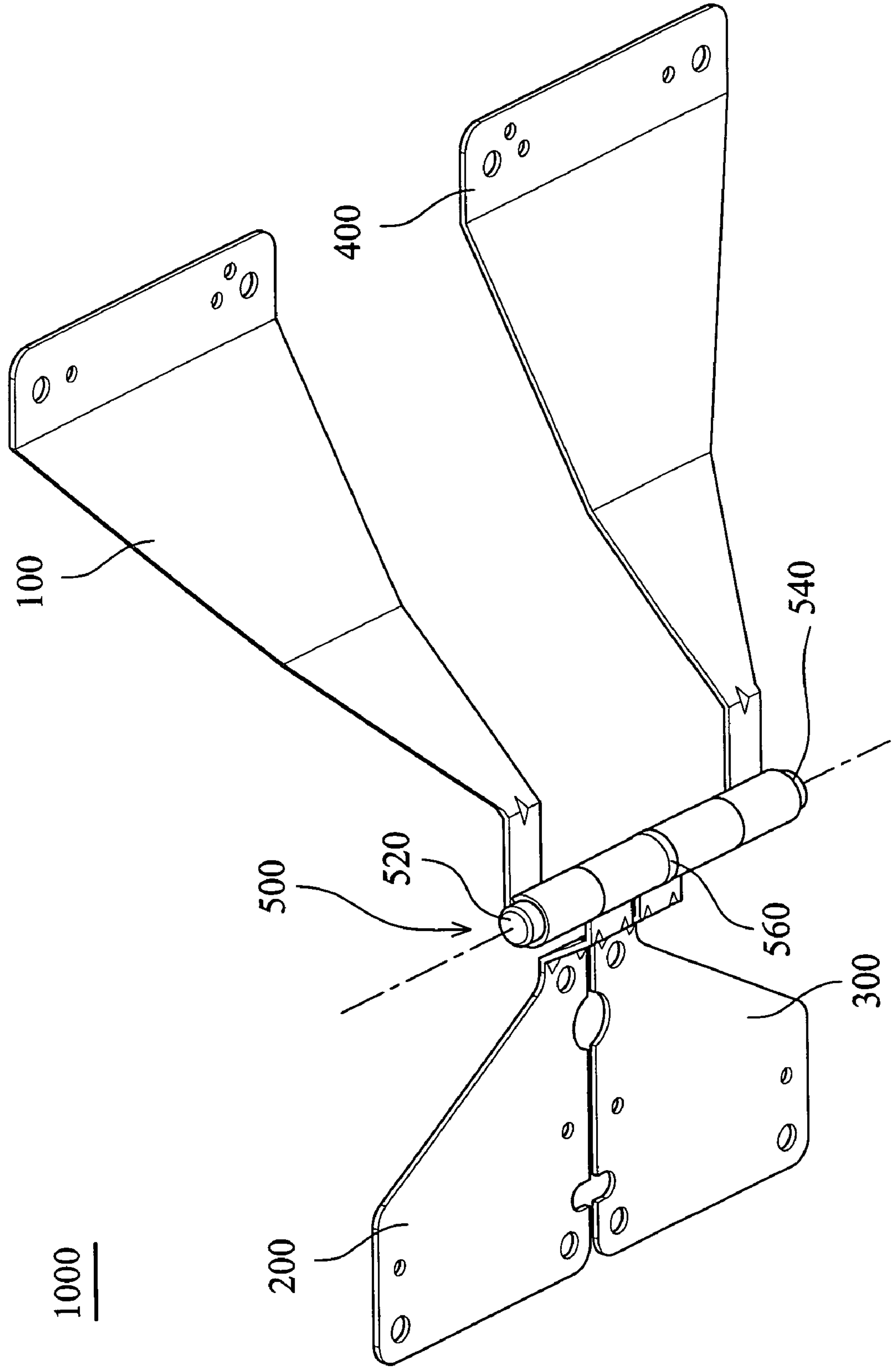
FIG. 5 is a perspective view of an electrical connection structure according to an embodiment of the invention.
Figure 6:
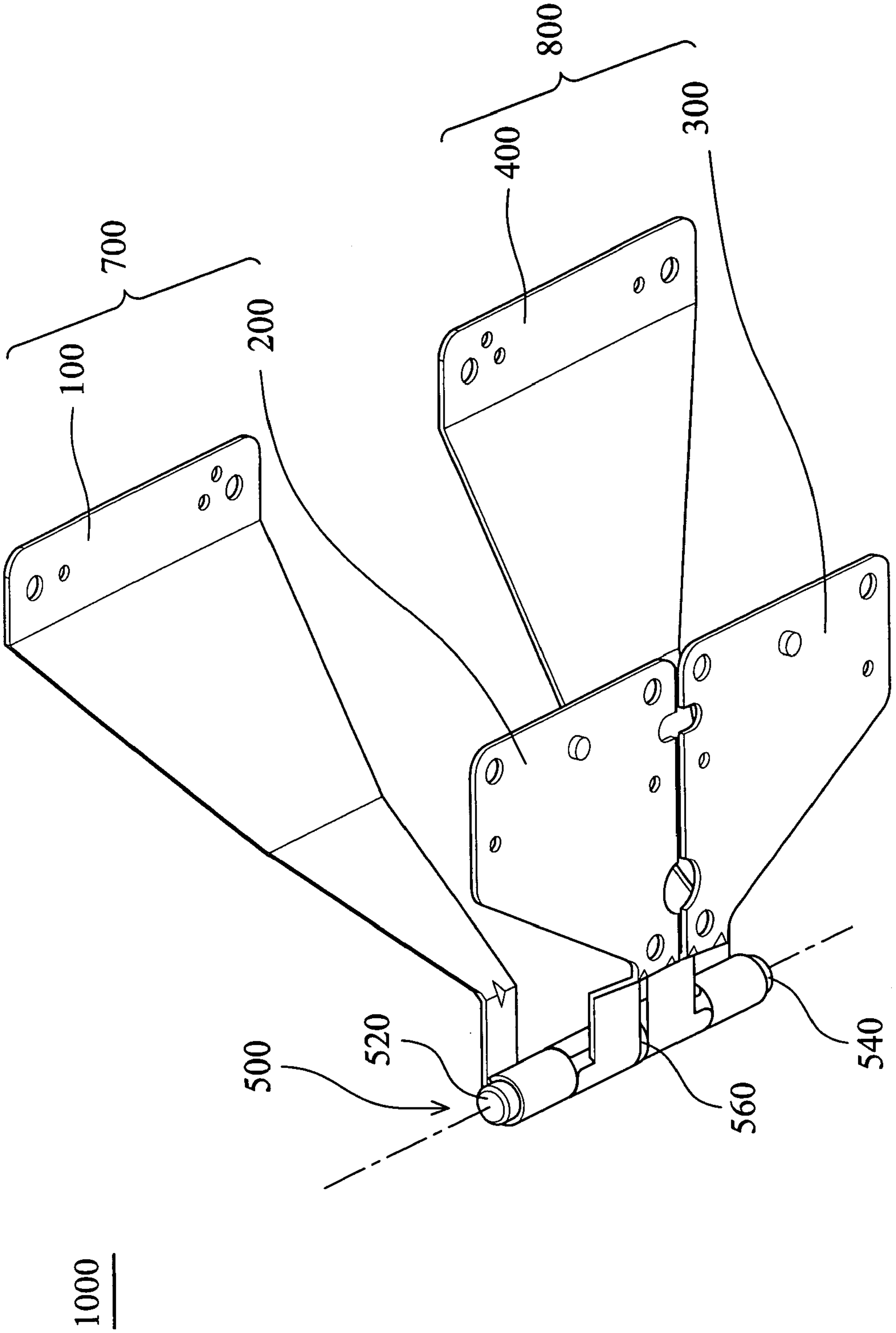
FIG. 6 is another perspective view of an electrical connection structure according to an embodiment of the invention.
Figure 7:
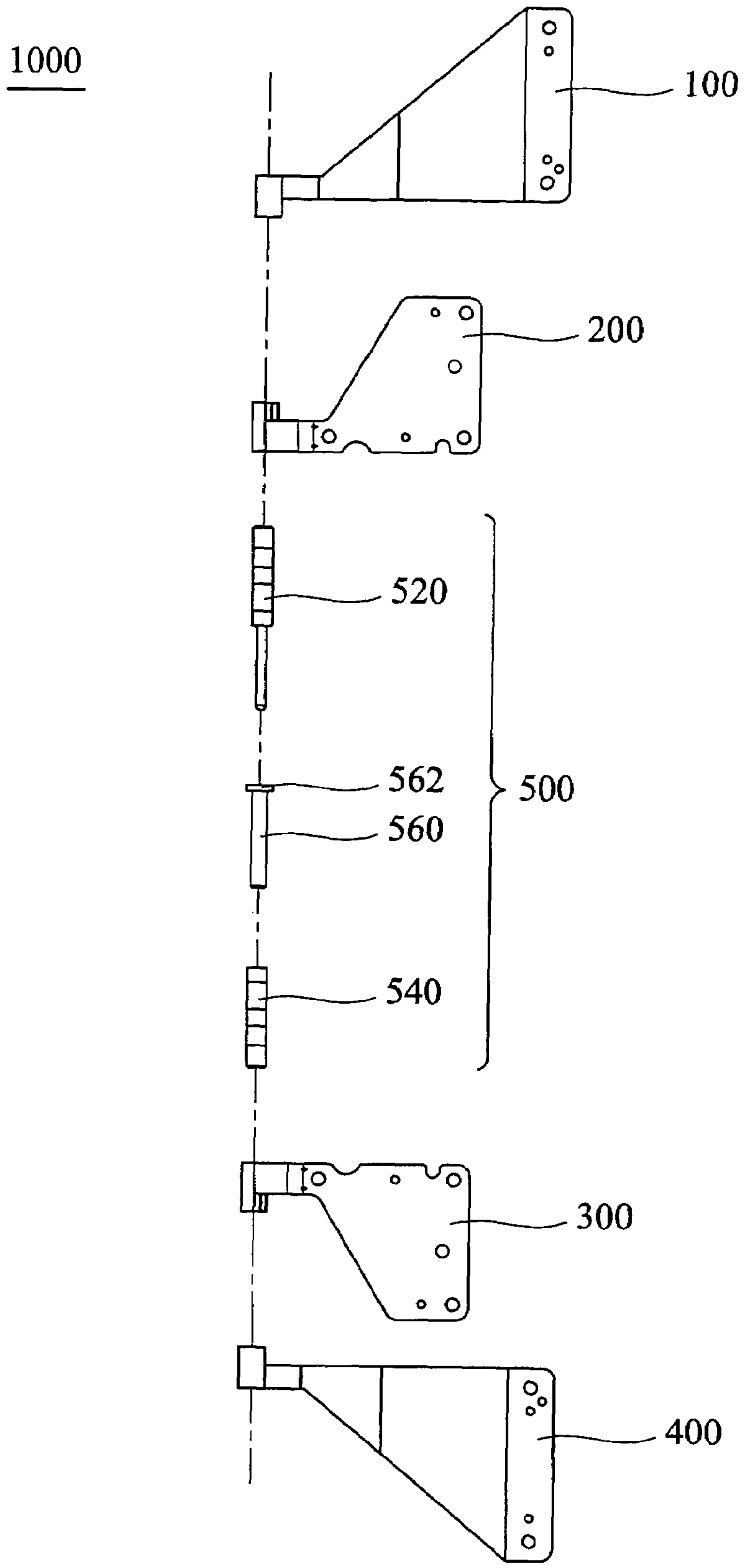
FIG. 7 is an exploded perspective view of an electrical connection structure according to an embodiment of the invention.

In FIGS. 5, 6 and 7, the electrical connection structure comprises a first conductor 100, a second conductor 200, a third conductor 300, a fourth conductor 400 and a shaft 500. The shaft 500 comprises a first portion 520, a second portion 540 and an insulator 560. The first and fourth conductors, 100 and 400, are disposed in the speaker 60, and the second and third conductors, 200 and 300, are disposed within the main body 50. The first and second conductors, 100 and 200, pivoted on the first portion 520 are capable of rotating with respect to each other. Similarly, the third and fourth conductors, 300 and 400, pivoted on the second portion 540 are capable of rotating with respect to each other.

Referring to FIG. 6, the first and second portions 520 and 540 are made of copper, and the insulator 560 is made of teflon. The first conductor 100 and the second conductor 200 electrically connected to the first conductor 100 via the first portion 520 constitute a first conduction module 700. The third conductor 300 and the fourth conductor 400 electrically connected to the third conductor 300 via the second portion 540 constitutes a second conduction module 800. The first conduction module 700 can rotate with respect to the second conduction module 800. As the first portion 520 joins the second portion 540 via the insulator 560 to insulate the first portion 520 from the second portion 540, the first conduction module 700 is insulated from the second conduction module 800, whereby two sets of signals are transmitted via the first conduction module 700 and the second conduction module 800 separately without short-circuiting, for example, the first conduction module 700 can be connected to a positive electrode of a power supply, and the second conduction module 800 to a negative electrode thereof.

Referring to FIG. 7, the insulator 560 is tubular and comprises a flange 562. The first portion 520 is cylindrical and inserted into the insulator 560, and the second portion 540 is tubular and encircles the insulator 560, whereby the shaft 500 is assembled. The first and second conductors 100 and 200 are pivoted on the first portion 520 for electrical connection. The third and fourth conductors, 300 and 400, are pivoted on the second portion 540 for electrical connection. The second conductor 200 and the third conductor 300 abut two opposite sides of the flange 562 respectively to prevent electrical contact therebetween, that is to avoid short-circuit between the first conduction module 700 and the second conduction module 800.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrical connection structure, comprising:
- a shaft comprising an insulator with a flange;
- a first conduction module pivoted on the shaft; and
- a second conduction module pivoted on the shaft and rotated with respect to the first conduction module, wherein the insulator is disposed between the first and second conduction modules, thereby insulating the first conduction module from the second conduction module, wherein the flange is disposed between the first conduction module and the second conduction module.

2. The electrical connection structure as in claim 1, wherein the first conduction module comprises:
- a first conductor pivoted on the shaft; and
- a second conductor pivoted on the shaft, electrically connected to the first conductor and rotated with respect to the first conductor;
- the second conduction module comprises:
- a third conductor pivoted on the shaft; and
- a fourth conductor pivoted on the shaft, electrically connected to the third conductor and rotated with respect to the third conductor, wherein the insulator is disposed between the second and third conductors, thereby insulating the second conductor from the third conductor so as to insulate the first connection module from the second conduction module.

3. The electrical connection structure as in claim 1, wherein the insulator is made of teflon.

4. The electrical connection structure as in claim 2, wherein the shaft further comprises:
- a first portion on which the first and second conductors are pivoted; and
- a second portion, on which the third and fourth conductors are pivoted, joining the first portion via the insulator, thereby insulating the first portion from the second portion.

5. The electrical connection structure as in claim 4, wherein the first and second conductors are electrically connected via the first portion.

6. The electrical connection structure as in claim 4, wherein the third and fourth conductors are electrically connected via the second portion.

7. The electrical connection structure as in claim 4, wherein the insulator comprises a tubular body on which the flange is disposed.

8. The electrical connection structure as in claim 7, wherein the flange is disposed between the second and third conductors, thereby insulating the second conductor from the third conductor.

9. The electrical connection structure as in claim 7, wherein the first portion is cylindrical and inserted into the body; the second portion is tubular and encircling the body, whereby the insulator connects the first and second portions.

10. A display, comprising:
- a main body;
- a shaft disposed on the main body and comprising a insulator;
- a speaker pivoted on the shaft;
- a first conduction module pivoted on the shaft; and
- a second conduction module pivoted on the shaft and rotated with respect to the first conduction module, wherein the insulator is disposed between the first and second conduction modules, thereby insulating the first conduction module from the second conduction module.

11. The display as in claim 10, wherein the first conduction module comprises:
- a first conductor pivoted on the shaft and electrically connected to the main body; and
- a second conductor pivoted on the shaft and electrically connected to the first conductor and the main body respectively;
- the second conduction module comprises:
- a third conductor pivoted on the shaft and electrically connected to the speaker; and
- a fourth conductor pivoted on the shaft and electrically connected to the third conductor and the main body, wherein the insulator is disposed between the second and third conductors, thereby insulating the second conductor from the third conductor so as to insulate the first conduction module from the second conduction module.

12. The display as in claim 10, wherein the insulator is made of teflon.

13. The display as in claim 11, wherein the shaft further comprises: a first portion on which the first and second conductors are pivoted; and a second portion, on which the third and fourth conductors are pivoted, joining the first portion via the insulator, thereby insulating the first portion from the second portion.

14. The display as in claim 13, wherein the first and second conductors are electrically connected via the first portion.

15. The display as in claim 13, wherein the third and fourth conductors are electrically connected via the second portion.

16. The display as in claim 13, wherein the insulator comprises a tubular body and a flange disposed on the body.

17. The display as in claim 16, wherein the flange is disposed between the second and third conductors, thereby insulating the second conductor from the third conductor.

18. The display as in claim 16, wherein the first portion is cylindrical and inserted into the body; the second portion is tubular and encircling the body, whereby the insulator connects the first and second portions.

* * * * *